United States Patent
Weaver et al.

(10) Patent No.: US 7,250,310 B1
(45) Date of Patent: Jul. 31, 2007

(54) PROCESS FOR FORMING AND ANALYZING STACKED DIE

(75) Inventors: Kevin Weaver, San Jose, CA (US); Chetan S. Paydenkar, Mountain View, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 553 days.

(21) Appl. No.: 10/873,814

(22) Filed: Jun. 21, 2004

(51) Int. Cl.
*H01L 21/00* (2006.01)
*G01R 31/26* (2006.01)

(52) U.S. Cl. ........................ 438/14; 324/765
(58) Field of Classification Search ............... 438/14; 324/500, 765
See application file for complete search history.

(56) References Cited

U.S. PATENT DOCUMENTS

| | | | | |
|---|---|---|---|---|
| 5,483,174 A | * | 1/1996 | Hembree et al. | 324/765 |
| 6,039,899 A | * | 3/2000 | Martin et al. | 264/1.36 |
| 6,245,586 B1 | * | 6/2001 | Colvin | 438/15 |
| 6,331,728 B1 | * | 12/2001 | Chang et al. | 257/676 |
| 6,590,409 B1 | * | 7/2003 | Hsiung et al. | 324/765 |
| 7,112,981 B1 | * | 9/2006 | Gao | 324/765 |

* cited by examiner

*Primary Examiner*—William David Coleman
(74) *Attorney, Agent, or Firm*—Jurgen Vollrath

(57) ABSTRACT

In a stacked die integrated circuit structure, the structure can subsequently be tested by removing any packaging material and separating the die from a die paddle and from each other. The separation can involve the use of chemicals or heat, with or without the use of mechanical force. One aspect of the invention includes making use of specifically chosen adhesives to secure the die to the die paddle and to each other, so that any subsequent removal can readily be achieved.

19 Claims, 2 Drawing Sheets

PROCESS FOR FORMING AND ANALYZING STACKED DIE

FIELD OF THE INVENTION

The invention relates to stacked die and a process for testing stacked die that are subsequently found to display faulty behavior. The invention also provides a new process for forming stacked die that makes it easier to subsequently test the die for identifying faults on the die.

BACKGROUND OF THE INVENTION

An ongoing trend in integrated circuits (ICs) is the attempt to reduce the footprint of the IC. This is addressed, for example, by introducing new processes that allow the gate length to be reduced and thereby allow more transistors to be formed on an IC.

Another recent solution is to provide more than one die on a packaged chip, wherein the die are stacked on top of each other and separated by an insulating material. A typical stacked die is shown in FIG. 1, which shows a bottom dice 100 secured by means of silver epoxy 102 (such as Ablestik 8340) to a die paddle 104. A second, or top, dice 106 is secured to the bottom dice 100 by means of an adhesive layer 108 which can be a Teflon based epoxy such as Loctite Qmi 500. The entire structure, comprising the paddle 104, bottom die 100 and top die 106 are encased in a packaging material, typically referred to as a package (not shown in FIG. 1) and commonly made of a plastics material. In order to provide electrical contact to the two die 100, 106, each die is provided with contacts along its periphery, and bonding wires (not shown) are connected to the contacts by means of gold ball bonds 110. As shown in FIG. 1, in order to avoid the top die 106 from interfering with the gold ball bonds 110 of the bottom die 100, the top die 106, in this embodiment, is smaller than the bottom die 100. However, it should be noted that this configuration is shown for illustration purposes only. More than two die can be stacked on top of each other and at the time of this application, stacking four die on top of each other is known in the art. Also, it is not necessary that the die be smaller toward the top of the stack. The epoxy layers and spacers between the die can sufficiently space the die to accommodate the gold ball bonds.

A problem facing the industry is in the testing of such stacked die devices after they have been stacked and packaged. It is common for faulty die to be returned by customers (e.g. original equipment manufacturers (OEMs)) to the manufacturer for analysis to determine the cause of the fault. In the case of non-stacked die this involves the decapping of the IC, i.e. the top of the package is removed by mechanical grinding or chemical etching. With the IC exposed, electrical testing contacts (other than the I/O contacts on the periphery of the IC become accessible for attaching needles of testing equipment or otherwise testing the IC. However, in the case of a stacked device, there is more than one die. Thus, at least some of the electrical contacts and circuitry of the bottom die are typically covered by the top die, and cannot be accessed. Furthermore, it may not always be possible to isolate the characteristics of individual devices since the functioning of devices on one die is impacted by the devices on the other die, since the die are interconnected to allow all of the die to work as one large IC. This interconnection may take place externally (on the printed circuit board on which the stacked device is mounted), or by die-to-die gold wire bonds, or internally by having vias through the epoxy between the die, to thereby allow electrical connection between contacts on one die and contacts of another die.

The present invention seeks to provide a way of testing stacked ICs and also seeks to provide a process for forming stacked ICs that makes the ICs more amenable to subsequent testing.

SUMMARY OF THE INVENTION

The invention relates to a method of testing a stacked, packaged IC that includes an IC package, at least two die packaged in the package, a die paddle on which the die are mounted, and bonding wires connected to at least one of the die, the method comprising removing at least part of the IC package, and separating the die from each other and from the die paddle.

The method may also comprise separating the bonding wires from the die. The bonding wires may be connected to the die by means of gold ball bonds and the separating may include severing the bond wires and then breaking or cutting the bonding wires or mechanically grinding the bond wires off at the neck of the bond. The breaking may include repeated bending to break the wires by wire fatigue. The cutting may include microtome cutting. The removal of at least part of the package may include, for example, chemical etching or mechanical grinding. The stacked IC may include adhesive such as epoxy for securing the die to each other and to the die paddle, and the removal of the die from the die paddle and from each other may include placing the IC in an acid bath, or applying heat to at least part of the IC, or thermally shocking the IC by first heating and then suddenly cooling it, and may include applying a mechanical force between the two parts being separated. The mechanical force may be applied by securing the one part and applying force, e.g. by means of a shear tool, to the other part. The heat may, for example, be applied by passing heated inert gas over at least part of the IC or by placing at least part of the IC on a heated hot plate surface. The sudden cooling in order to shock the IC, may include placing the IC in a water bath, e.g. water at room temperature (e.g. approximately 15 to 35 degrees Celsius). The one part may be secured by placing it against a barrier, e.g. a metal barrier that is held in place relative to a surface on which the IC is placed, or is temporarily or permanently secured to the surface on which the IC is placed. The surface on which the IC is placed may be a heated hot plate surface. The microtome cutting of the bond wires may include mounting the IC on a microtome tool, which may include securing the IC by means of wax to the microtome tool. The cutting typically comprises slicing the neck of the bond, where the bond wire connects to the gold ball bonds. The method may further include cleaning epoxy or other adhesive material from the die once they are separated from the die paddle and when they are separated from each other, e.g., by oxygen plasma cleaning.

Further, according to the invention, there is provided a method of forming a stacked IC that includes at least two die stacked on top of each other, comprising connecting the die to each other by means of a light sensitive adhesive, such as a ultraviolet sensitive resin, which breaks down when exposed to certain frequencies of light. The stacked IC may include a die paddle on which the die are mounted. The die may be secured to the die paddle by means of a light sensitive adhesive, such as a ultraviolet sensitive resin, which breaks down when exposed to certain frequencies of light.

DETAILED DESCRIPTION OF THE INVENTION

Figure 1:
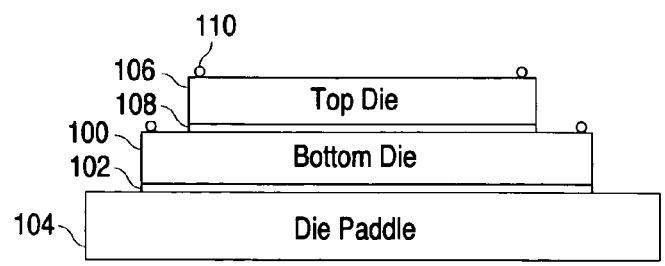
FIG. 1 shows one embodiment of a simple prior art stacked IC.

In one embodiment of the invention, stacked IC such as the one illustrated in FIG. 1 is tested by separating the individual die 100, 106 making up the IC, into separate parts, and then connecting each of the dice to a separate lead frame for facilitating applying power and input/output (I/O) signals to the dice. For ease of discussion, the reference numerals used in FIG. 1 will be used in this embodiment of the invention to refer to the parts of the stacked IC.

To simplify this process, it will be appreciated that the structural integrity of each of the dice cannot be compromised, the die have to be clean and the existing contacts (in this case, the gold ball bonds) should remain intact.

In one embodiment of the invention, the packaging material is removed using mechanical grinding or acid etching in a manner known in the art. Thereafter, the bond wires are cut, e.g., using wire cutters, and then the die are separated from the die paddle 104, and the die 100, 106, are separated from each other. The die are then cleaned by removing any adhesive material adhering to the die surfaces and by breaking, cutting or grinding the bond wire pieces sticking out beyond the neck of the bond.

The removal of the bond wires will be discussed in further detail below with respect to FIG. 4.

Figure 2:
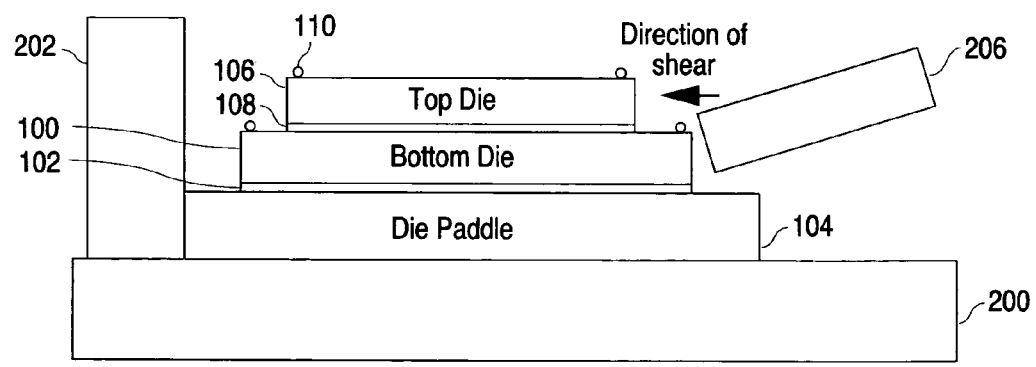
FIG. 2 shows one embodiment of the method of the invention for testing a stacked IC such as the IC of FIG. 1.

The separation of the stacked die from the die paddle 104 is done either by immersing the device (with the packaging and bond wires removed) into an acid bath, e.g. fuming nitric (having a concentration of about 86% or more), or by applying heat to the device, e.g., by placing the die paddle onto a hot plate surface at 330 degrees Celsius, as shown in the embodiment of FIG. 2, or, as proposed in one embodiment, by placing the die paddle onto a hot plate surface at 330° C. for about one minute followed by immersion in water at 20° C. In another embodiment, heat may be applied to the die paddle 104 and die 102, 106 by exposing the structure to heated inert gas, e.g., in a gas chamber, or the heated inert gas may be applied to the structure by passing heated inert gas over the structure. It will be appreciated that the term structure refers here to the die paddle 104 and stacked set of die, in this case, die 102, 106. In this embodiment the separation of the two die 103, 106 from the die paddle 104 is assisted by exerting a mechanical force on the die 102, 106 using a shear tool 206 (in one embodiment comprising a flexible piece of heat resistant Teflon), while holding the die paddle 104 in place, e.g., using a metal barrier 202 that is physically held in place by a person or secured relative to the hot plate surface 200.

Figure 3:
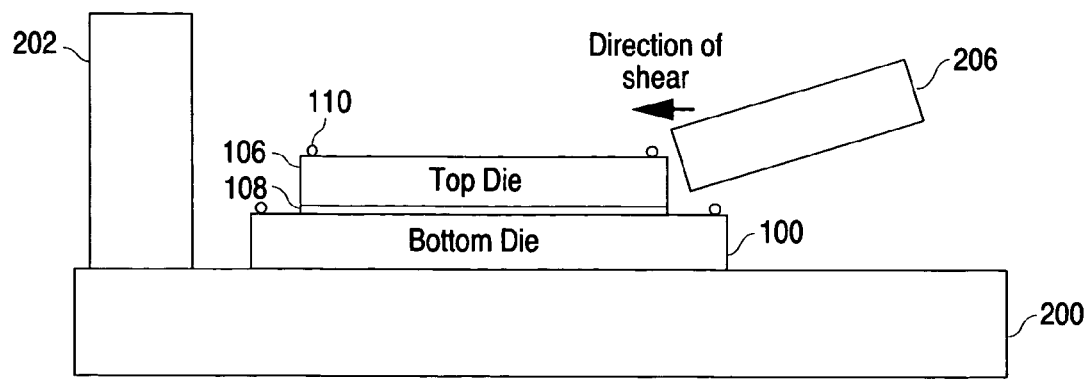
FIG. 3 shows another step in the method of FIG. 2.

As shown in FIG. 3, the top die 106 is then separated from the bottom die 100 in a similar fashion, by placing the lower die 104 on the hot plate surface 200 and securing it using the metal barrier or shear stop 202. (FIG. 3 does not show the adhesive layer 102 but, in practice, at least some of the epoxy or other adhesive will still be adhering to the lower surface of the lower die 100. The upper die 106 is then pushed mechanically, again by making use of the shear tool 206. It will be appreciated that the advantage of using a hot plate as the heating element rather than an inert gas is that it allows the mechanical shearing force to easily be applied at the same time rather than having the heating and shearing force steps be conducted sequentially, or having to make use of a mechanical or remotely manipulated shear tool while the device is located in an inert gas chamber.

Once the die in the stacked device have been separated by the method described above or another method such as an acid bath or heat alone, any resin adhering to the surfaces of the die has to be removed. Once common resin used between the lower dice and the die paddle is silver epoxy to a thickness of about 50 μm, while a Teflon based epoxy to a thickness of about 10 μm is commonly used between the die. In the embodiment shown in FIG. 2, the adhesive layer 102 is silver epoxy 50 μm in thickness, and the adhesive layer 108 is a Teflon based epoxy 10 μm in thickness.

In one embodiment, the cleaning of the die is done by placing the die in an oxygen plasma, however, other embodiments have made use of sulphuric acid (e.g at 95%) or other solvents.

Figure 4:
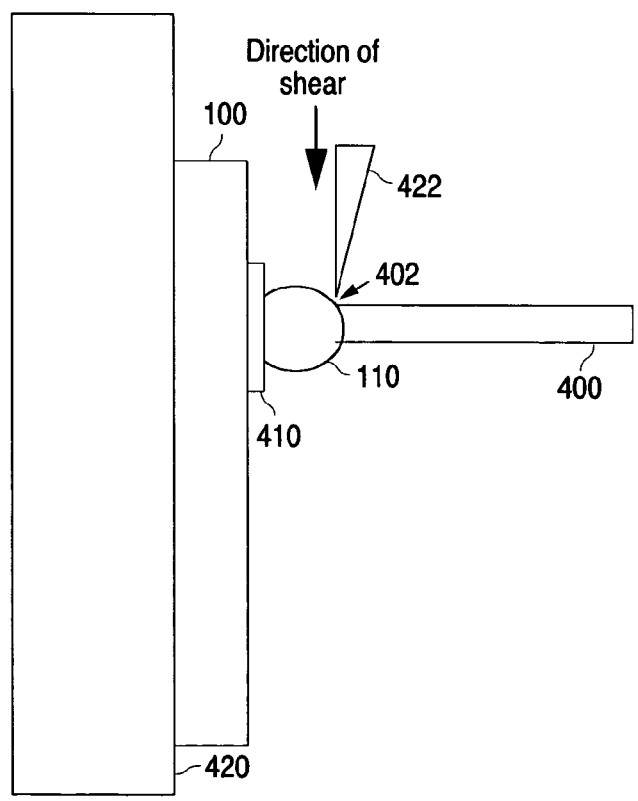
FIG. 4 shows yet another step in the method of FIG. 2.

FIG. 4 shows the process of removing the bond wires 400, sticking out beyond the neck 402 of the gold ball bond 110 of the die 100. As shown in FIG. 4, each gold ball bond 110 is connected to a bond pad 410. In this embodiment, the bond wire 400 sticking out from the neck 402 is removed by making use of a microtome tool having a sample mount 420 on which the die 100 is mounted, and a microtome blade 422. The blade 422 is slidably connected to the mount 420 and adjustable in distance relative to the mount 420 to allow the position of the blade to be adjusted to coincide with the necks of the bonds. The blade is then moved parallel to the surface of the die 100 to cut the bond wires 400 at the necks 402 of the bonds. In this embodiment the die were first cleaned of adhesive residue before the pieces of bond wire 400 were cut. It will be appreciated that the cleaning step could also be done after the bond wires are removed.

The rest of the testing of the die would be done in a manner known in the art for separate die. For instance, each of the die would be connected to a separate lead frame by means of new bond wires, bonded to existing cut balls or exposed bonding pads, and then the power and input/output leads would be applied to the dice, using the lead frame. CONFIRM. A test apparatus would supply the necessary power and input signals and would monitor the output signals to determine whether there is any faulty behavior and to narrow down the area of concern before the die is further broken down, e.g., by parallel lapping or by cross-sectioning.

Currently die are typically attached to the die paddle using an epoxy such as Ablestik 8340, supplied by Ablestik, which is about 25 to 125 μm thick and has a silver filler, or using a die attach film (DAF) such as Nitto EM 100 DAF, supplied by Nitto Denko, which is only about 10–40 μm thick and has a silica filler. Dice are, in turn, typically attached to each other by means of an epoxy such as Loctite Qmi 550 with spacers, supplied by Loctite, which is about 25 to 125 μm thick and has a Teflon filler, or using a die attach film such as Hitachi FH-800 DAF (supplied by Hitachi) which is only about 10–40 μm thick and has a silica filler.

As a further feature of the invention and as yet another embodiment of a method of separating the die for testing, the present application provides for a method of connecting the die to each other and to the die paddle by making use of an adhesive that degenerates rapidly or breaks down under certain conditions, e.g. under certain radiation conditions such as ultraviolet (UV) light. Applicant is aware of Hitachi FH-800, a resin which is cured by exposure to UV light.

Applicant is currently working on obtaining details on resins or other adhesives that rapidly break down when exposed to UV light. Thus in one embodiment, the die would be attached to each other and to the die paddle by a UV sensitive adhesive such as a UV sensitive epoxy. In the absence of exposure to UV radiation, the die and die paddle would remain firmly secured to each other. However, when the need arises to test the die individually, they would readily be removable from the die paddle and each other by exposing the die and die paddle to UV radiation. It will be appreciated that other types of adhesives could be used that rapidly break down when exposed to certain radiation or chemical. This will allow not only for the easy separation of the die from the die paddle and each other but also simplifies or automatically takes care of the removal of any remaining adhesive adhering to the die surface. Thus this part of the cleaning step can be eliminated altogether.

More generally, while the invention was described with respect to a specific embodiment and by referring to a few specific examples, the invention is not so limited but includes any embodiments within the scope of the claims.

What is claimed is:

1. A method of testing a stacked, packaged IC that includes an IC package, at least two die packaged by the package, a die paddle on which the die are mounted, and bonding wires connected to at least one of the die, the method comprising:
   removing at least part of the IC package, and
   separating the die from each other and from the die paddle.

2. A method of claim 1, further comprising separating the bonding wires from the die.

3. A method of claim 1, wherein the removal of at least part of the package includes chemical etching or mechanical grinding of the package.

4. A method of claim 1, wherein the die are attached to each other and to the die paddle by means of an adhesive, and the removal of the die from the die paddle and from each other includes placing the IC, after the removal of at least part of the IC package, in an acid bath, or applying heat to at least part of the IC, or thermally shocking the IC by first applying heat and then suddenly cooling the IC.

5. A method of claim 2, wherein the separating of the bonding wires is performed prior to separating the die from each other and from the die paddle.

6. A method of claim 2, wherein the bonding wires are connected to the die by means of gold ball bonds and the separating of the wires includes breaking or cutting the bonding wires or mechanically grinding the bond wires off where the wires meet the gold ball bonds.

7. A method of claim 6, wherein the breaking includes repeated bending to break the wires by wire fatigue.

8. A method of claim 6, wherein the cutting includes microtome cutting.

9. A method of claim 8, wherein the microtome cutting of the bonding wires includes mounting the IC on a microtome tool.

10. A method of claim 9, where the mounting on the microtome tool includes securing the IC by means of wax to the microtome tool.

11. A method of claim 4, wherein the removal of the die from the die paddle and from each other further includes applying a mechanical force between the two parts being separated.

12. A method of claim 4, wherein the heat is applied by passing heated inert gas over at least part of the IC or by placing at least part of the IC on a hot plate surface.

13. A method of claim 4, wherein the sudden cooling in order to shock the IC, includes placing the IC in a water bath.

14. A method of 4, further comprising cleaning the adhesive from the die once they are separated from the die paddle and when they are separated from each other.

15. A method of claim 11, wherein the mechanical force is applied by securing the one part and applying force to the other part using a shear tool.

16. A method of claim 15, wherein the one part is secured by placing it against a barrier that is held in place relative to a surface on which the IC is placed, or that is temporarily or permanently secured to the surface on which the IC is placed.

17. A method of claim 16, wherein the surface on which the IC is placed is a hot plate surface.

18. A method of claim 13, wherein water in the water bath is approximately 15 to 35° C.

19. A method of claim 14, wherein the cleaning includes oxygen plasma cleaning.

* * * * *